(12) United States Patent
Lin et al.

(10) Patent No.: US 9,075,526 B2
(45) Date of Patent: Jul. 7, 2015

(54) CAPACITIVE TOUCH KEYBOARD

(75) Inventors: Jaoching Lin, Taipei (TW); Linabel Chu, Taipei (TW); Chung-Yi Shen, New Taipei (TW); Gary Lee, Taipei (TW)

(73) Assignee: Sentelic Corporation, Taipei (TW)

( * ) Notice: Subject to any disclaimer, the term of this patent is extended or adjusted under 35 U.S.C. 154(b) by 402 days.

(21) Appl. No.: 13/479,635

(22) Filed: May 24, 2012

(65) Prior Publication Data
US 2012/0306756 A1 Dec. 6, 2012

(30) Foreign Application Priority Data

Jun. 3, 2011 (TW) .............................. 100210165 U

(51) Int. Cl.
G06F 3/02 (2006.01)
G06F 3/0488 (2013.01)
H03K 17/96 (2006.01)

(52) U.S. Cl.
CPC .......... *G06F 3/04886* (2013.01); *G06F 3/0202* (2013.01); *H03K 17/9622* (2013.01); *G06F 2203/04809* (2013.01); *H03K 2217/96062* (2013.01)

(58) Field of Classification Search
USPC ................................................ 345/156–174
See application file for complete search history.

(56) References Cited

U.S. PATENT DOCUMENTS

| | | | | |
|---|---|---|---|---|
| 2007/0273560 A1* | 11/2007 | Hua et al. | ......................... | 341/33 |
| 2007/0279395 A1* | 12/2007 | Philipp et al. | ................. | 345/173 |
| 2010/0245135 A1* | 9/2010 | Camacho et al. | ............... | 341/33 |
| 2010/0295814 A1* | 11/2010 | Kent et al. | ..................... | 345/174 |
| 2011/0241999 A1* | 10/2011 | Thier | ............................ | 345/168 |

FOREIGN PATENT DOCUMENTS

TW 377645 M 4/2010

* cited by examiner

*Primary Examiner* — Jimmy H Nguyen
*Assistant Examiner* — Kwin Xie
(74) *Attorney, Agent, or Firm* — CKC & Partners Co., Ltd.

(57) ABSTRACT

A capacitive touch keyboard includes an insulating substrate that defines a plurality of press key zones, and a first and a second conductive layers, both disposed on the insulating substrate. Each conductive layer includes a plurality of electrode lines arranged in two different directions. Each electrode line includes a plurality of electrode units connected in series. Each electrode unit is disposed at a position corresponding to a respective one of the press key zones. For each of the press key zones, the electrode units of the first the second conductive layers that are disposed therein are adjacent to each other and cooperate to form a touch sensing structure.

10 Claims, 6 Drawing Sheets

CAPACITIVE TOUCH KEYBOARD

CROSS-REFERENCE TO RELATED APPLICATION

This application claims priority to Taiwanese Application No. 100210165, filed on Jun. 3, 2011.

BACKGROUND OF THE INVENTION

1. Field of the Invention

The invention relates to a touch keyboard, and more particularly to a capacitive touch keyboard.

2. Description of the Related Art

Referring to FIG. 1, a conventional capacitive touch keyboard defines a plurality of press key zones 15 on a touch panel 1, and a controller 11 determines which one of the press key zones 15 is touched mainly based on a sensed touch signal from the touch panel 1. The touch panel 1 has an insulating substrate 10, and a first indium tin oxide (ITO) conductive layer and a second ITO conductive layer disposed on the insulating substrate 10 (on different surfaces or overlap on a same surface of the insulating substrate 10). The first ITO conductive layer includes a plurality of first electrode lines X1~Xm arranged in a first direction, and each of the first electrode lines X1~Xm includes a plurality of first electrodes 12 connected in series. The second ITO conductive layer includes a plurality of second electrode lines Y1~Yn arranged in a second direction transverse to the first direction. Each of the second electrode lines Y1~Yn includes a plurality of second electrodes 13 connected in series, and each of the second electrodes 13 is separated from adjacent one of the first electrodes 12.

For such array-type touch structure, the first electrode lines X1~Xm and the second electrode lines Y1~Yn must be uniformly and densely disposed on the surface of the touch panel 1 in order to sense a touch signal from each position of the touch panel 1, thus resulting in more electrode lines. However, for a touch keyboard, while positions of the press keys are fixed, i.e., sensing of areas out of the press key zones 15 on the touch panel 1 is not needed, the controller 11 still detects the whole touch panel 1 when determining whether specific press key zones 15 are touched. Moreover, touch zones and coordinates corresponding to each of the press key zones 15 need to be preset, thus increasing loadings and difficulty of the identification.

SUMMARY OF THE INVENTION

Therefore, an object of the present invention is to provide a capacitive touch keyboard which may simplify detecting circuits and may reduce difficulty of identification.

According to the present invention, a capacitive touch keyboard comprises:

an insulating substrate that defines a plurality of press key zones separated from each other, the insulating substrate having opposite first and second surfaces;

a first conductive layer disposed on the first surface of the insulating substrate, and including a plurality of first electrode lines arranged in a first direction, each of the first electrode lines including a plurality of first electrode units connected in series, each of the first electrode units being disposed at a position corresponding to a respective one of the press key zones; and a second conductive layer disposed on one of the first surface and the second surface of the insulating substrate, and including a plurality of second electrode lines arranged in a second direction different from the first direction, each of the second electrode lines including a plurality of second electrode units connected in series, each of the second electrode units being disposed at a position corresponding to a respective one of the press key zones;

wherein, for each of the press key zones, the first electrode unit and the second electrode unit that are disposed therein are adjacent to each other and cooperate to form a touch sensing structure.

Preferably, the capacitive touch keyboard further comprises a controller electrically coupled to the first electrode lines and the second electrode lines. The controller has coordinates preset therein. The coordinates correspond to the touch sensing structures of the press key zones. The controller is operable to detect whether the touch sensing structures of the press key zones sense a touch signal, and to output a coordinate signal based on the coordinate corresponding to the touch sensing structure of the press key zone that sensed the touch signal.

By disposing one touch sensing structure on each corresponding press key zone, and none of the touch sensing structures is disposed out of the press key zones, thus resulting in much smaller numbers of the electrode lines to be scanned and simpler calculation for the controller to detect whether the touch sensing structure of the press key zone senses a touch signal.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENT

Figure 1:
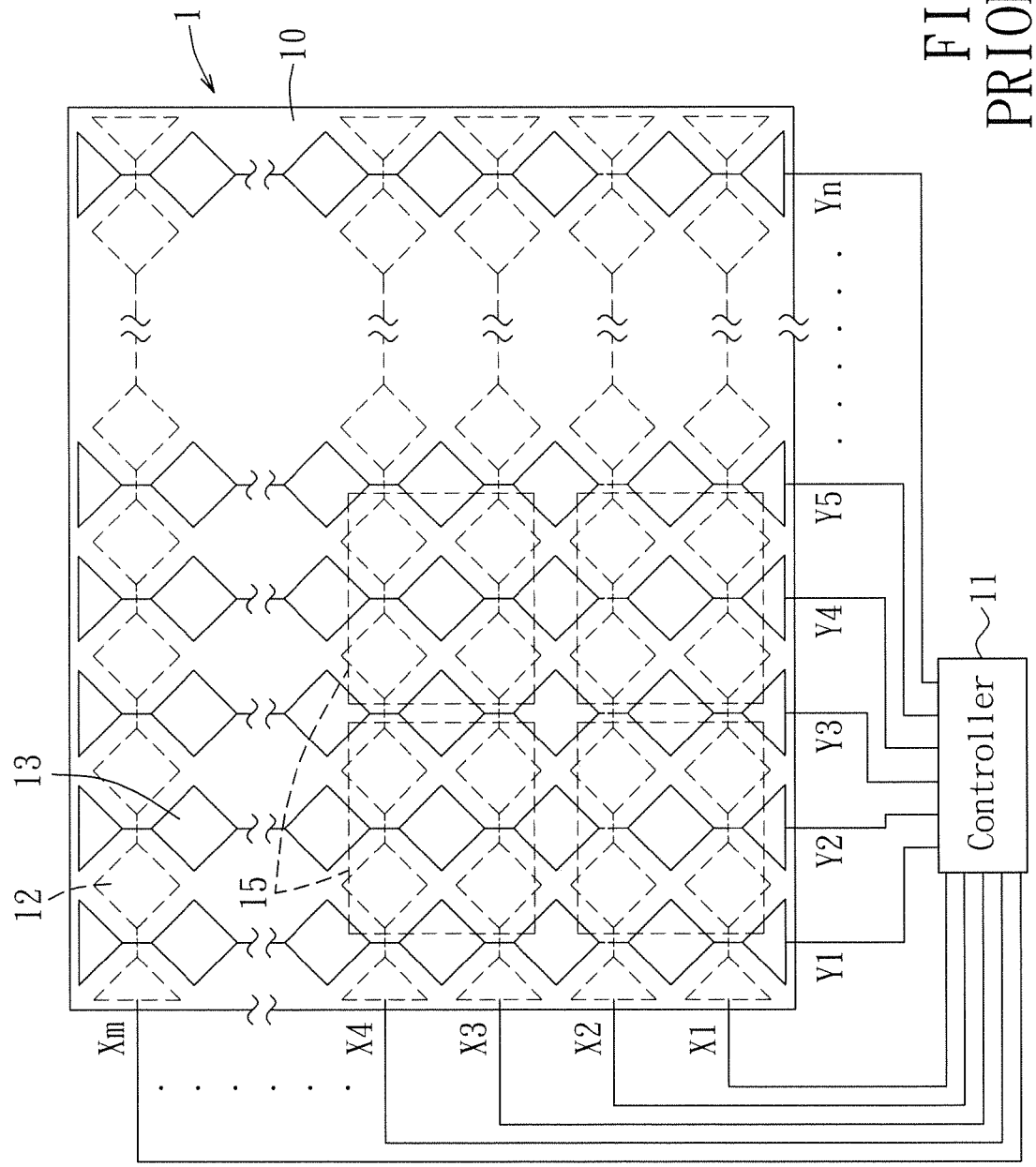
FIG. 1 is a schematic diagram showing a capacitive touch panel of a conventional capacitive touch keyboard.
Figure 2:
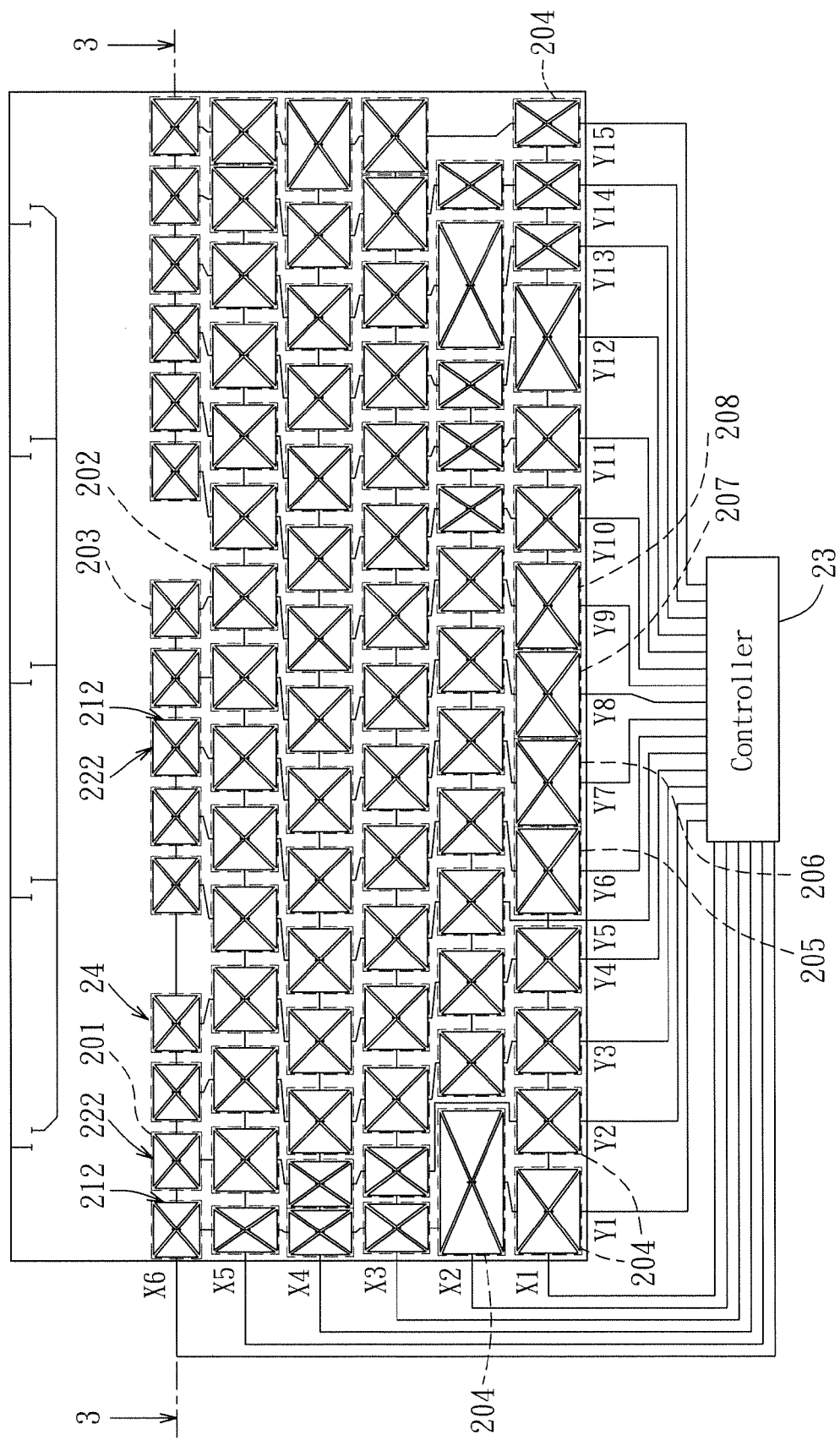
FIG. 2 is a schematic diagram showing a first preferred embodiment of a capacitive touch keyboard according to the present invention.
Figure 3:
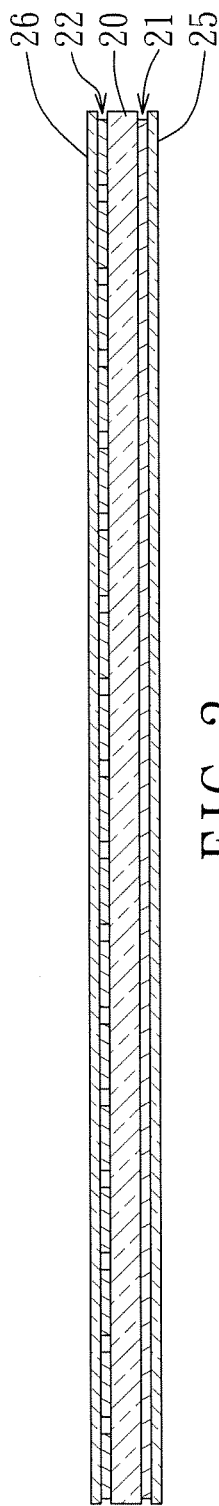
FIG. 3 is a sectional side view of the capacitive touch keyboard taken along line 3-3 in FIG. 2.

Referring to FIG. 2 and FIG. 3, the first preferred embodiment of the capacitive touch keyboard according to this invention is shown to comprise an insulating substrate 20, a first conductive layer 21, a second conductive layer 22 and a controller 23. The insulating substrate 20, which could be a transparent plastic plate, such as polyethylene terephthalate (PET) plate, defines a plurality of press key zones 201 separated from each other, and has opposite first and second surfaces. Each of the press key zones 201 represents the size and position of a corresponding press key of the capacitive touch keyboard.

The first conductive layer 21, which could be an indium tin oxide (ITO) layer, is disposed on the first surface of the insulating substrate 20, and is covered with an insulating thin film 25. The first conductive layer 21 includes a plurality of first electrode lines X1~X6 arranged in a first direction, such as a Y-axis direction in this embodiment. Each of the first electrode lines X1~X6 includes a plurality of first electrode units 212 connected in series, and each of the first electrode units 212 is disposed at a position corresponding to a respective one of the press key zones 201.

The second conductive layer 22, which could also be an ITO layer, is disposed on the second surface of the insulating substrate 20 in this embodiment. The second conductive layer 22 includes a plurality of second electrode lines Y1~Y15 arranged in a second direction substantially transverse to the first direction, such as an X-axis direction in this embodiment. Each of the second electrode lines Y118Y15 includes a plurality of second electrode units 222 connected in series, and each of the second electrode units 222 is disposed at a position corresponding to a respective one of the press key zones 201. For each of the press key zones 201, the first electrode unit 212 and the second electrode unit 222 that are disposed therein are adjacent to each other and cooperate to form a touch sensing structure 24.

It should be noted that the first conductive layer 21 and the second conductive layer 22 could also be disposed on the same surface of the insulating substrate 20 and overlap in other embodiments of this invention. The overlapping parts of the first conductive layer 21 and the second conductive layer 22 could be separated by an insulator.

Figure 4:
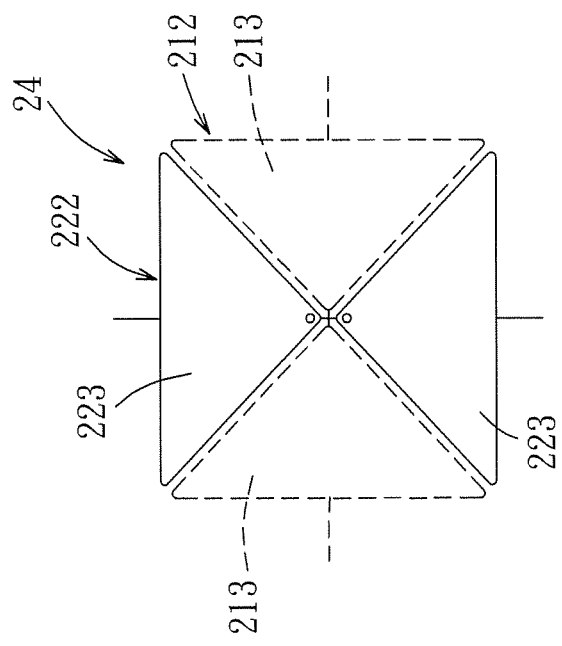
FIG. 4 is a schematic diagram showing a touch sensing structure of the first preferred embodiment.

In this embodiment, as shown in FIG. 4, each of the first electrode units 212 includes two first triangular electrodes 213. A vertex of one of the first triangular electrodes 213 is connected to a vertex of the other one of the first triangular electrodes 213. Each of the second electrode units 222 includes two second triangular electrodes 223. A vertex of one of the second triangular electrodes 223 is connected to a vertex of the other one of the second triangular electrodes 223. For each of the press key zones 201, the two second triangular electrodes 223 are separate from and adjacent to the two first triangular electrodes 213, and cooperate with the two first triangular electrodes 213 to form the touch sensing structure 24 in a rectangular shape.

Moreover, a transparent insulating thin film or a transparent insulating cover lens 26 may be disposed over the second conductive layer 22 in order to isolate the second conductive layer 22, as shown in FIG. 3.

The controller 23 is electrically coupled to the first electrode lines X1~X6 and the second electrode lines Y1~Y15 and has coordinates preset therein. The coordinates correspond to the touch sensing structures 24 of the press key zones 201, such as (X1, Y1), (X2, Y1), (X4, Y5), etc. The controller 23 is operable to detect whether the touch sensing structures 24 of the press key zones 201 sense a touch signal, and to output a coordinate signal based on the coordinate corresponding to the touch sensing structure 24 of the press key zone 201 that sensed the touch signal.

Positions of the press key zones 201 of the capacitive touch keyboard could be arranged according to American keyboard definition, European keyboard definition, a game keyboard definition, etc. Taking the American keyboard definition as an example, the press key zones 201 includes a plurality of alphanumeric key zones 202 disposed in a middle region, function key zones 203 disposed in an upper region, modifier key zones 204 disposed in lower, left and right regions, a space key zone disposed in a lower center region and formed by multiple adjacent press key zones 205~208, etc.

According to the present invention, by disposing one touch sensing structure 24 on each corresponding press key zone 201, and none of the touch sensing structures 24 is disposed out of the press key zones 201, each of the press key zones 201 can have a clear and unique coordinate, thus resulting in much smaller numbers of the electrode lines to be scanned and simpler calculation for the controller 23 to detect whether the touch sensing structures 24 of the press key zones 201 sense a touch signal.

The modifier key zones 204 could be touched with other key zones simultaneously to trigger special operations, and the controller 23 could decide which two (or more than two) of the press key zones (one of which belongs to the modifier key zones) are touched by multi-finger touch scan, such as mutual capacitance scan or self-capacitance scan based on time difference.

Figure 5:
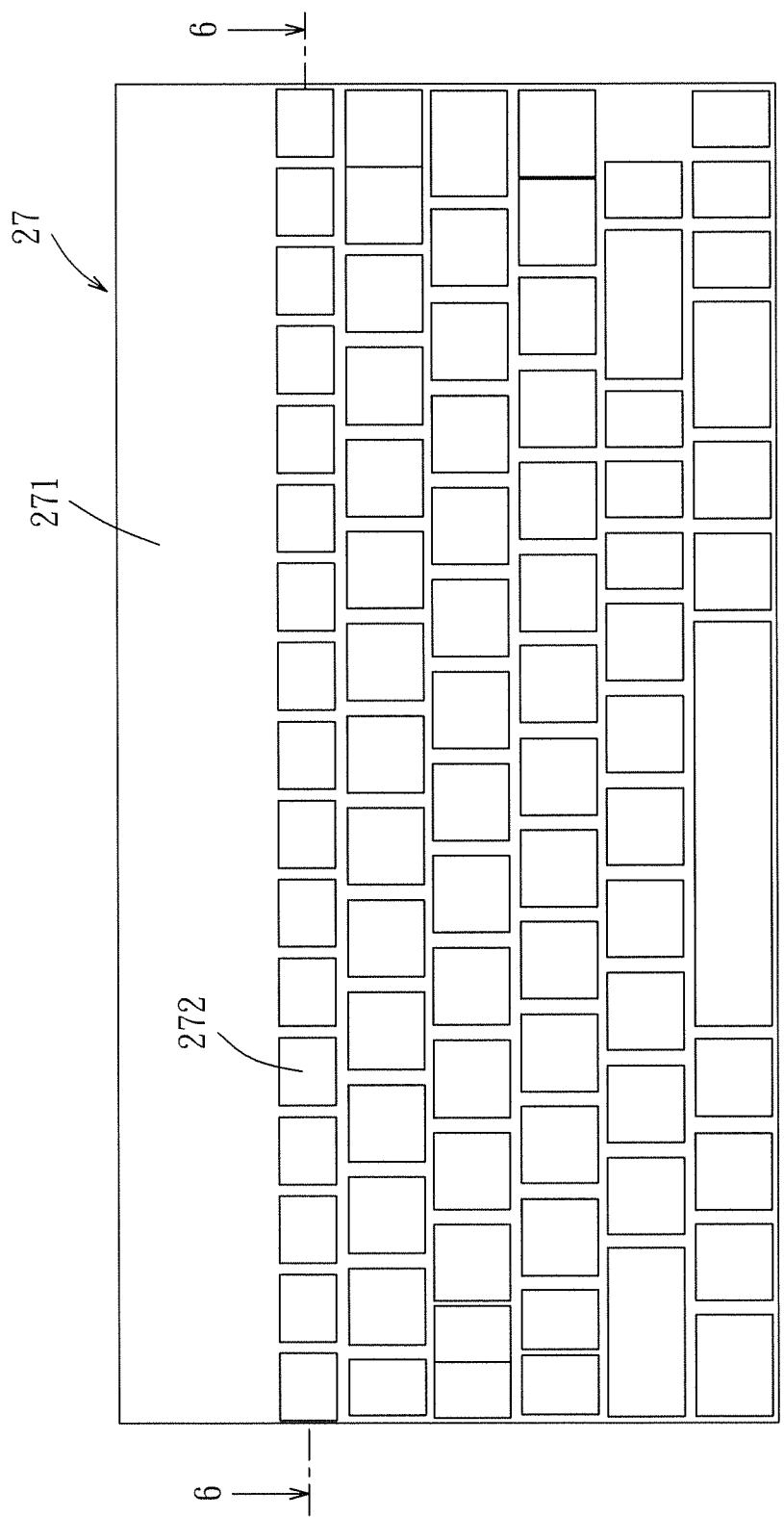
FIG. 5 is a schematic diagram showing a capacitive touch keyboard of the first preferred embodiment including a resilient press key plate disposed on a insulating substrate thereof.
Figure 6:
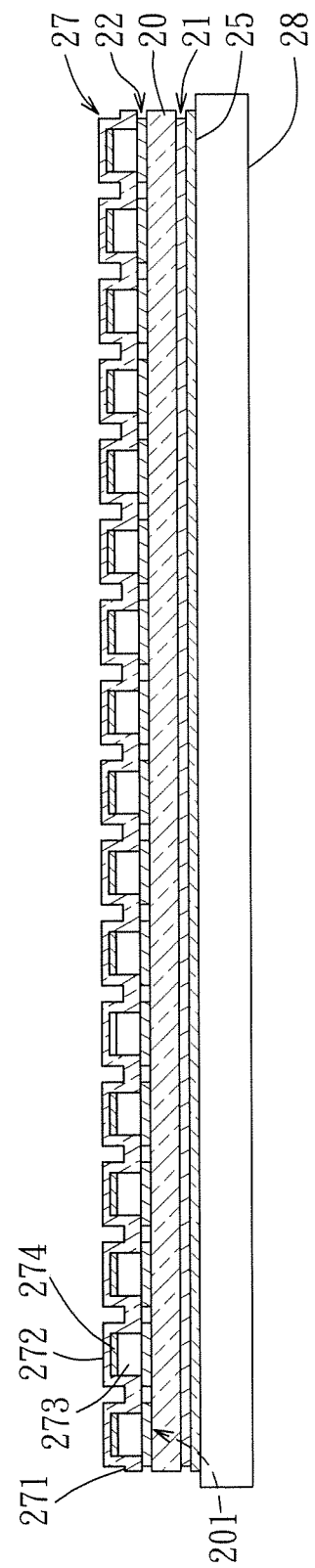
FIG. 6 is a sectional side view of the capacitive touch keyboard taken along line 6-6 in FIG. 5.

Referring to FIG. 5 and FIG. 6, aside from disposing a transparent insulating thin film or a transparent insulating cover lens 26 over the second conductive layer 22 of the capacitive touch keyboard, a resilient press key plate 27 could also be disposed over the second conductive layer 22 or the transparent insulating cover lens 26, so as to provide press feeling to assist users when putting fingers on correct press key positions. The resilient press key plate 27 includes an insulating plate body 271 and a plurality of press key parts 272 formed integrally with the insulating plate body 271. The press key parts 272 protrude from the insulating plate body 271 at positions corresponding to the press key zones 201, and each of the press key parts 272 has one of an input mark, a control mark, and a function mark on a surface thereof. Alternatively, the resilient press key plate 27 could be transparent, and the capacitive touch keyboard further comprises a display component 28 disposed on the first surface of the insulating substrate 20, such that the display component 28 is able to display visible marks at positions respectively corresponding to the press key zones 201 through the insulating substrate 20 and the resilient press key plate 27. Therefore, it is possible for users to press the press key parts 272 for triggering the touch sensing structures 24 disposed on the press key zones 201 thereunder to enable sensing of a touch signal, and to obtain press feeling similar to mechanical keyboards through the resilient restoring force of the press key parts 272.

Each of the press key parts 272 could be formed with a cavity 273 that opens toward the insulating substrate 20 in order to enhance deformability, such that when the press key parts 272 are pressed, fingers would sink in more easily to result in a more evident pressing feeling. Additionally, the resilient press key plate 27 could include a plurality of conductors 274, such as ITO, in order to enhance sensitivity of capacitive coupling between the touch sensing structures 24 and fingers. Each of the conductors 274 is disposed on an inner surface of a respective one of the press key parts 272 that defines the cavity 273.

Figure 7:
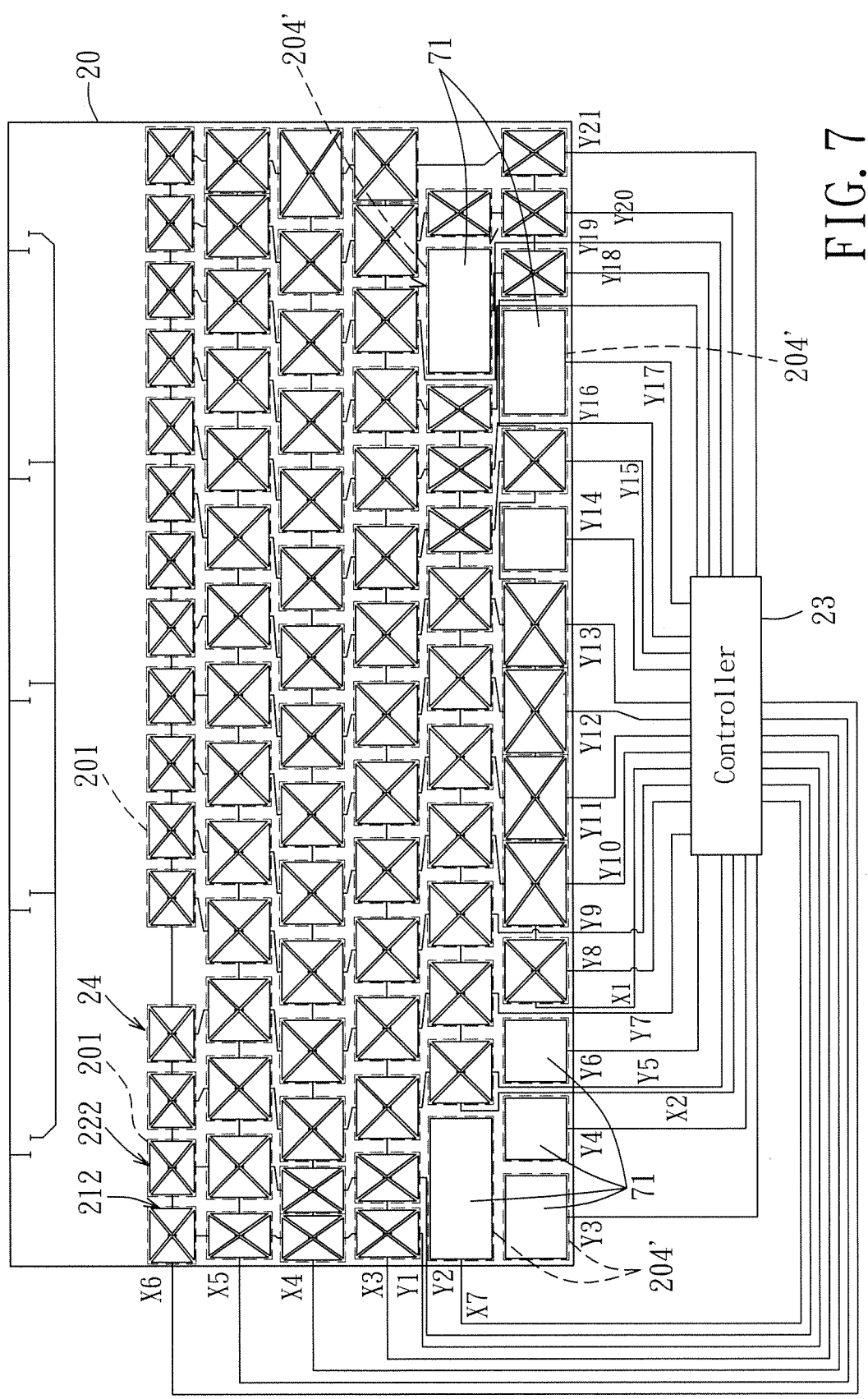
FIG. 7 is a schematic diagram showing a second preferred embodiment of a capacitive touch keyboard according to the present invention.

FIG. 7 shows the second preferred embodiment of the capacitive touch keyboard according to the present invention. The difference between the second preferred embodiment and the first preferred embodiment resides in that the insulating substrate 20 further defines a plurality of independent press key zones that serve as the modifier key zones 204'. Each of the independent press key zones includes a third electrode unit 71 (a rectangular electrode) electrically coupled to the controller 23. The controller 23 is operable to detect whether the third electrode units 71 of the independent press key zones sense a touch signal, and to output a corresponding key signal when the touch signal is sensed by the third electrode unit 71.

In this embodiment, the controller 23 could independently decide whether the modifier key zones 204' sense a touch signal without multi-finger touch scan by setting multiple modifier key zones 204' as independent press key zones, resulting in easier identification for the controller 23.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A capacitive touch keyboard comprising:
an insulating substrate that defines a plurality of press key zones separated from each other, said insulating substrate having opposite first and second surfaces;
a first conductive layer disposed on said first surface of said insulating substrate, and including a plurality of first electrode lines arranged in a first direction, each of said first electrode lines including a plurality of first electrode units connected in series, each of said first electrode units being disposed at a position corresponding to a respective one of said press key zones; and
a second conductive layer disposed on one of said first surface and said second surface of said insulating substrate, and including a plurality of second electrode lines arranged in a second direction different from said first direction, each of said second electrode lines including a plurality of second electrode units connected in series, each of said second electrode units being disposed at a position corresponding to a respective one of said press key zones;
wherein each of said first electrode units includes two first triangular electrodes, a vertex of one of said first triangular electrodes being connected to a vertex of the other one of said triangular electrodes; and
each of said second electrode units includes two second triangular electrodes, a vertex of one of said second triangular electrodes being connected to a vertex of the other one of said second triangular electrodes;
wherein, for each of said press key zones, said two second triangular electrodes are separate from and adjacent to said two first triangular electrodes, and cooperate with said two first triangular electrodes to form said touch sensing structure in a rectangular shape.

2. The capacitive touch keyboard as claimed in claim 1, further comprising a controller electrically coupled to said first electrode lines and said second electrode lines, said controller having coordinates preset therein, said coordinates corresponding to said touch sensing structures of said press key zones, said controller being operable to detect whether said touch sensing structures of said press key zones sense a touch signal, and to output a coordinate signal based on the coordinate corresponding to said touch sensing structure of said press key zone that sensed the touch signal.

3. The capacitive touch keyboard as claimed in claim 2, wherein said insulating substrate further defines an independent press key zone, said independent press key zone including a third electrode unit electrically coupled to said controller, said controller being operable to detect whether said third electrode unit of said independent press key zone senses a touch signal, and to output a corresponding key signal when the touch signal is sensed by said third electrode unit.

4. The capacitive touch keyboard as claimed in claim 1, further comprising a resilient press key plate disposed on said second surface of said insulating substrate and over said touch sensing structures, said resilient press key plate including a plate body and a plurality of press key parts disposed on said plate body, wherein said press key parts protrude from said plate body at positions corresponding to said press key zones.

5. The capacitive touch keyboard as claimed in claim 4, wherein each of said press key parts has one of an input mark, a control mark, and a function mark on a surface thereof.

6. The capacitive touch keyboard as claimed in claim 5, wherein each of said press key parts is formed with a cavity that opens toward said insulating substrate.

7. The capacitive touch keyboard as claimed in claim 6, wherein said press key plate includes a plurality of conductors, each disposed on an inner surface of a respective one of said press key parts that defines said cavity.

8. The capacitive touch keyboard as claimed in claim 4, wherein each of said press key parts is formed with a cavity that opens toward said insulating substrate.

9. The capacitive touch keyboard as claimed in claim 8, wherein said press key plate includes a plurality of conductors, each disposed on an inner surface of a respective one of said press key parts that defines said cavity.

10. The capacitive touch keyboard as claimed in claim 4, further comprising a display component disposed on said first surface of said insulating substrate, each of said insulating substrate and said resilient press key plate being transparent, said display component having a plurality of visible marks at positions respectively corresponding to said press key zones and visible through said insulating substrate and said resilient press key plate.

* * * * *